United States Patent [19]

Challen

[11] Patent Number: 4,521,918
[45] Date of Patent: Jun. 4, 1985

[54] BATTERY SAVING FREQUENCY SYNTHESIZER ARRANGEMENT

[75] Inventor: Richard F. Challen, Lynchburg, Va.

[73] Assignee: General Electric Company, Lynchburg, Va.

[21] Appl. No.: 205,516

[22] Filed: Nov. 10, 1980

[51] Int. Cl.³ .................... H04B 1/02; H03L 7/02; H03L 7/06

[52] U.S. Cl. ................................... 455/343; 455/119; 331/14; 331/17

[58] Field of Search ............ 455/119, 125, 127, 165, 455/183, 185, 117, 75, 76, 217, 343; 331/1 A, 10, 11, 14, 16, 17, 18, 25, 23, 30, 34; 332/19; 330/9; 358/191.1, 195.1

[56] References Cited

U.S. PATENT DOCUMENTS

| | | | |
|---|---|---|---|
| 3,546,618 | 12/1970 | Menkes | 331/10 |
| 3,568,085 | 3/1971 | Pimenoff | 331/14 |
| 3,609,577 | 9/1971 | Bos | 331/17 |
| 3,614,648 | 10/1971 | Byrne | 331/14 |
| 3,619,784 | 11/1971 | Wycoff | 455/127 |
| 3,660,781 | 5/1972 | Tewksbury et al. | 331/1 A |
| 3,721,909 | 3/1973 | Pincus | 331/14 |
| 3,857,108 | 12/1974 | Kanow | 331/14 |
| 4,053,933 | 10/1977 | Collins | 358/191.1 |
| 4,069,462 | 1/1978 | Dunn | 331/11 |
| 4,105,946 | 8/1978 | Ikeda | 331/1 A |
| 4,128,849 | 12/1978 | Rhee | 455/185 |

FOREIGN PATENT DOCUMENTS 2209134 3/1973 Fed. Rep. of Germany.

Primary Examiner—Tommy P. Chin
Attorney, Agent, or Firm—Cushman, Darby and Cushman

[57] ABSTRACT

An arrangement for reducing the amount of battery supplied power to a high frequency synthesizer. The phase-locked loop section of the synthesizer is periodically disconnected from the battery supplied power. In order to prevent substantial drift of the phase-locked loop during such power interruption, a control signal is provided for maintaining the VCO frequency. By minimizing the frequency drift, the loop can be re-locked in a short period of time following each power interruption.

4 Claims, 2 Drawing Figures

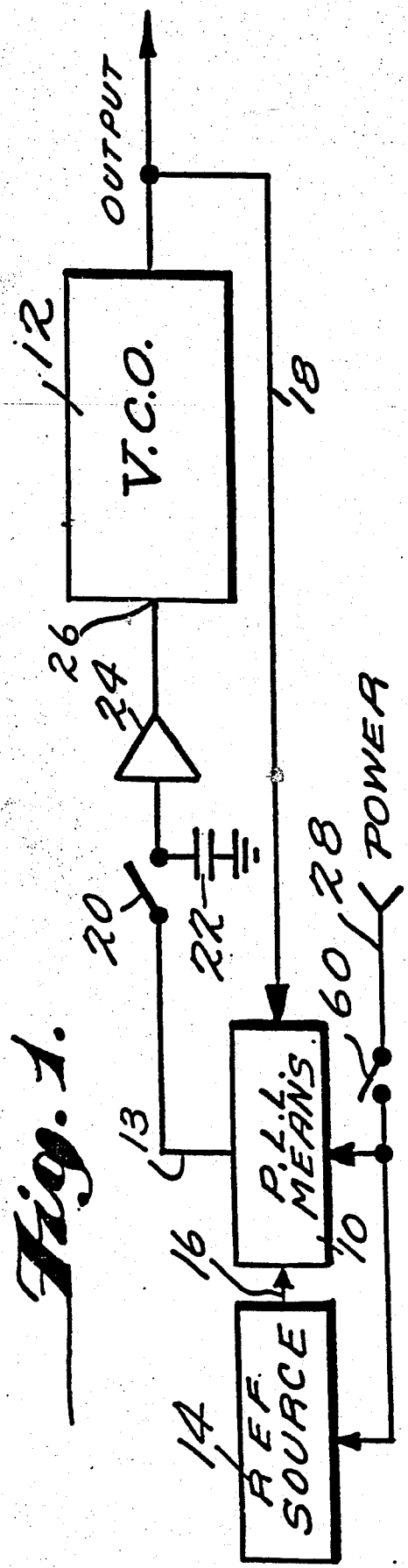
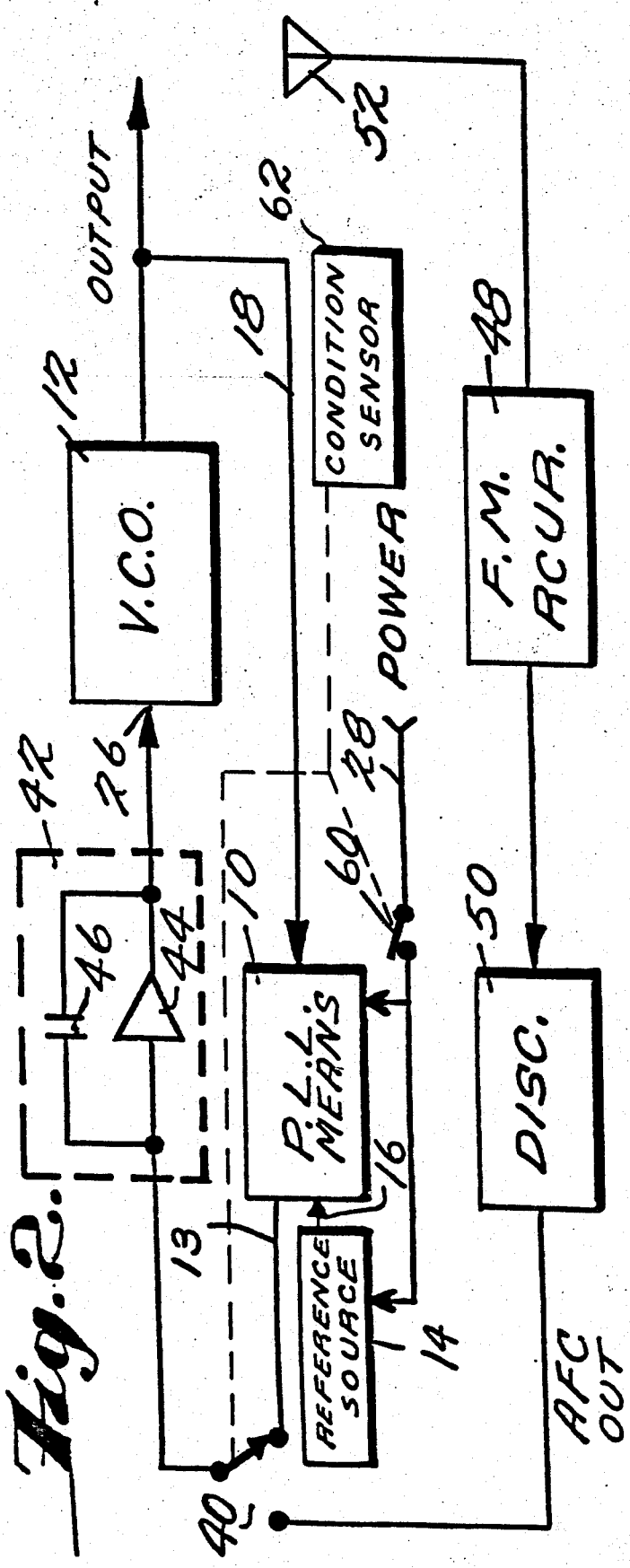

BATTERY SAVING FREQUENCY SYNTHESIZER ARRANGEMENT

BACKGROUND OF THE INVENTION

This invention relates generally to high frequency synthesizers. High frequency synthesizers are now commonly utilized substitutes for the crystal controlled transmitter oscillators and receiver local oscillators because they are able to provide a frequency stable signal at any one of a plurality of frequencies without the need of a crystal for each such frequency. Such synthesizers generally utilize a phase-locked loop including a voltage controlled oscillator (VCO), a reference oscillator, and a phase detector for comparing the output of the VCO with a reference source. Normally, one or more programmable or switchable multipliers or dividers are included within the phase-locked loop so that the loop can be locked to various multiples of the reference source frequency.

As high frequency synthesizers have become widely utilized, they have even been incorporated into portable or mobile battery powered radio communication equipment, such as cellular type radio telephone equipment. It has been found, however, that during normal operation, the phase-locked loop of a synthesizer requires substantial power to operate. Cellular radio equipment must spend large amounts of time receiving a signalling channel. During such reception, the phase-locked loop of its synthesizer is normally continuously operated. Under such operating conditions, the high power drain associated with the synthesizer expends the available battery power in an impractically short period of time.

SUMMARY OF THE INVENTION

In order to overcome the rapid battery drain associated with the continuous use of a phase-locked loop high frequency synthesizer in battery powered radio equipment, there is provided a high frequency synthesizer arrangement utilizing less battery power than conventional arrangements without sacrificing synthesizer performance.

For ease in discussion and illustration, a phase-locked loop synthesizer is considered to include a VCO, a phase-locked loop means, and a reference source. The phase-locked loop means includes a phase comparator and perhaps one or more programmable divideres and/or multipliers and a loop (low pass) filter. After appropriate division and/or multiplication, the phase-locked loop means compares the VCO signal output with that of the reference source and provides a loop control signal to the VCO for controlling its frequency.

In a first embodiment of the invention, a "memory circuit" functioning as a sample and hold, is coupled between the loop control signal output of the phase-locked loop and the control input of the voltage controlled oscillator. This memory circuit comprises a switch for opening and closing the control signal line from the phase-locked loop, a capacitor coupled so as to be charged by the control signal from the phase-locked loop when the switch is closed, and an amplifier having a high impedance input coupling the capacitor and switch to the control input of the voltage controlled oscillator. When the switch is closed the loop operates normally and locks. Once the loop has been locked, power to the phase-locked loop can be interrupted. During such power interruptions, the switch is opened and the voltage on the capacitor coupled to the input of the high impedance amplifier becomes the control signal for the voltage controlled oscillator. This control signal is equal in magnitude to the control signal from the phase-locked loop just before power to the loop was interrupted. The amplifier is selected to have a high input impedance so that the voltage on the capacitor will not discharge very rapidly and the voltage controlled oscillator will be prevented from drifting substantially. Before the voltage controlled oscillator can drift too far, power is reapplied to the phase-locked loop and the switch is again closed so that the loop can be relocked. The frequency and duration of power interruptions and attendant switch openings and the various circuit parameters are determined by how severely the loop drifts when unlocked.

Thus there is provided a method for frequency synthesizing using a phase-locked loop synthesizer comprising the steps of: generating, with phase-locked loop means, a loop control signal for use in controlling a voltage controlled oscillator (VCO) associated with the phase-locked loop means; sampling the magnitude of the loop control signal; generating a memory signal indicative of the sampled magnitude of the loop control signal; interrupting power to the phase-locked loop means; and applying the memory signal, simultaneously with the interruption of power, to a control input of the VCO for controlling its frequency during the power interruption.

As used in a cellular radio such as a mobile telephone, power to the phase-locked loop is normally interrupted (once the loop has been locked a first time). During the time power is interrupted, the switch of the memory means is open. Periodically power is automatically applied to the phase-locked loop and the switch is closed. In addition, power is continuously applied to the phase-locked loop in response to (a) a received command to switch frequency (synthesizer must switch to a new frequency) and transmit, or (b) a received command to transmit on the current frequency, (c) an off-hook condition or (d) a loss of a received signal.

In an alternative embodiment, during periods of power interruption to the phase-locked loop, the voltage controlled oscillator is controlled by the output of a receiver discriminator within the communication equipment. Switch means are provided for periodically switching the control input of the voltage controlled oscillator away from the loop control signal output of the phase-locked loop means and connecting it instead to the output of the discriminator. An integrator is coupled in the loop control signal path to the voltage controlled oscillator. In this second arrangement, the loop is first locked in the conventional manner. Then, the switch means switches the input of the integrator from its normal connection to the phase-locked loop to the output of the discriminator. Of course, using this arrangement, both the phase-locked loop and discriminator must have a zero voltage error signal during a locked condition. Properly designed FM receivers with S-type discriminators can produce a DC voltage proportional to the deviation of the local oscillator frequency and the transmitted signal carrier frequency. In this second embodiment, the phase-locked loop needs only be relocked in the traditional manner if the received signal is lost or when it is desired to change received channels.

Thus, there is provided a method for frequency synthesizing comprising the steps of: generating, with phase-locked loop means, a loop control signal for use in controlling a voltage controlled oscillator (VCO) associated with the phase-locked loop means; locking the phase-locked loop; decoupling the control input of the VCO from the phase-locked loop means and coupling it instead to the output of a receiver discriminator so that the VCO will be controlled by the discriminator output rather than the loop control signal from the phase-locked loop means; and interrupting power to the phase-locked loop means.

As used in a cellular radio, such as a mobile telephone, after the phase-locked loop has been initially locked, normally power to the phase-locked loop is disabled. During the time the phase-locked loop is disabled, the voltage controlled oscillator is driven by the receiver discriminator. Power is applied to the phase-locked loop whenever (a) a received command calling for a switch in frequency and transmission on the new frequency, (b) a received command calling for transmission on the current frequency, (c) an off-hook condition, or (d) loss of a received signal. A return to the normally disabled (power interrupted) condition of the phase-locked loop occurs in the absence of any of the (a)-(d) conditions above-listed.

In essence there is provided a method for operating radio communications equipment having a phase-locked loop synthesizer including phase-locked loop (PLL) means for generating a loop control signal and a voltage controlled oscillator (VCO) having a control input, comprising the steps of: (a) providing a sample and hold circuit coupling the loop control signal from the PLL means to the control input of the VCO; (b) locking the PLL means to provide the loop control signal to the sample and hold circuit; (c) causing the sample and hold circuit to sample the magnitude of the loop control signal; (d) interrupting power to the PLL means and allowing the sample and hold circuit to provide a control signal to the VCO based upon the magnitude of the loop control signal sampled, (e) periodically applying power to the PLL while activating the sample and hold circuit to re-sample the magnitude of the loop control signal from the PLL means, (f) continuously enabling the phase-locked loop and continuously sampling the loop control signal and continuously up-dating the output of the sample and hold signal to the VCO in response to any of the following: (aa) a received command to switch frequency and transmit on the new frequency, (bb) a received command to transmit on the current frequency, (cc) an off-hook condition, or (dd) loss of a received signal, and (g) returning to step (b) in the absence of the conditions of step (f).

There is also provided a method of operating radio communications equipment having a phase-locked loop synthesizer including phase-locked loop (PLL) means and a voltage controlled oscillator (VCO) wherein the equipment includes a receiving section having a discriminator, comprising the steps of: (a) locking the PLL means to provide a loop control signal to the VCO, (b) synchronously interrupting power to the PLL means and coupling a signal from the discriminator to the control input of the VCO to control its frequency, (c) enabling the PLL continuously in response to the occurrence of any of the following conditions: (aa) a received command calling for a switch in frequency and transmission on the new frequency, (bb) a received command calling for transmission on the current frequency, (cc) an off-hook condition, or (dd) loss of a received signal, and (d) returning to the PLL disabled state wherein the output of the discriminator drives the VCO in response to the absence of any conditions (aa) through (dd) above.

BRIEF DESCRIPTION OF THE DRAWINGS

The invention will become better understood by reference to the following detailed description and the appended claims when read in conjunction with the Figures, wherein:

FIG. 1 is a block diagram of a first embodiment of the frequency synthesizer arrangement according to the present invention; and FIG. 2 is a block diagram of a second embodiment of the frequency synthesizer arrangement according to the present invention.

DETAILED DESCRIPTION OF THE PREFERRED EMBODIMENT

Referring now to FIG. 1, there is shown a first embodiment of the battery saving frequency synthesizer circuit according to the present invention. As previously stated, phase-locked loop synthesizers generally include a voltage controlled oscillator (VCO) providing the output of the synthesizer, one or more dividers for dividing the output signal of the voltage controlled oscillator, a phase detector for comparing the direct or derivative (divided) signal from the VCO with a stable signal from a reference source, and a loop filter for receiving the comparison signal from the phase detector and providing a VCO control signal. By changing the divide ratio of the dividers, various multiples of the reference oscillator frequency can be locked onto by the phase-locked loop.

Phase-locked loop (PLL) 10 represents all of the components of a conventional phase locked loop synthesizer except for its voltage controlled oscillator (VCO) 12 shown as a separate block. The output of phase-locked loop 10 on a signal line 13 represents the loop control signal normally obtained from the loop filter of a phase-locked loop synthesizer. Thus, phase-locked loop 10 includes a phase comparator for comparing the signal output of VCO 12 with the signal from a reference source 14. In essence, the phase comparator of PLL 10 receives a signal from reference source 14 on a signal line 16 and the output of VCO 12 on a signal line 18. For the purposes of this description, the specific details of the phase-locked loop synthesizer 10 are omitted. The invention has general application to all phase-locked loop frequency synthesizers. The details for designing phase-locked loop synthesizers for specific applications can be obtained from a reading of "Frequency Synthesizers Theory and Design" by V. Manassewitsch, published by John Wiley & Sons, copyright 1976. Various phase-locked loops suitable for use as phase-locked loop 10 are even available in "off the shelf" integrated circuit packages.

The loop control signal on line 13 is coupled to one pole of a switch 20. The other pole of switch 20 is coupled to a capacitor 22 and to the input of an amplifier 24, the output of which is coupled to the control input 26 of VCO 12.

The phase-locked loop synthesizer operates as a conventional phase-locked loop when power is applied to PLL 10 and when switch 20 is closed. In this manner, the loop control signal on line 13 is coupled to capacitor 22 and to the input of amplifier 24. During "battery save" operation, switch 20 is opened and power to phase-locked loop 10 on a power line 28 is removed.

The means for interrupting power on line 28 to PLL 10 is symbolized by a switch 60. Of course, in a practical design, switch 60 would probably be an electronic switch driven by a pulse generator, or other suitable arrangement. During the time when power is interrupted to PLL 10 via switch 60 and switch 10 is open, power is maintained to VCO 12 and amplifier 24. Thus, during battery save operation, phase-locked loop 10 is disabled and the power normally drawn thereby is saved. The magnitude of the loop control signal on line 13, just before switch 20 is opened, is "memorized" by capacitor 22. The input to amplifier 24 is of sufficiently high impedance so that the voltage on capacitor 22 does not discharge substantially during the time interval that phase-locked loop 10 is disabled. Thus, the value of the loop control signal just before switch 20 is opened continues to be coupled to control input 26 of VCO 12 during the time that phase-locked loop 10 is disabled. Periodically, phase-locked loop 10 is reenergized via switch 60 and switch 20 is closed. Thus switches 20 and 60 are operated periodically and synchronously. This allows the loop to relock and reestablish a loop control signal before too much error builds up in the VCO output frequency due to drift.

This FIG. 1 arrangement is highly suitable for use in a cellular radio such as a mobile telephone. Operated in a mobile telephone, power, on line 28, is normally interrupted to PLL 10 (after a period of initial lock). During the time when power to PLL 10 is disabled, switch 20 is opened and VCO 12 is controlled by the signal on capacitor 22. PLL 10 is automatically recurrently enabled. During such time of enablement, switch 20 is closed so that the magnitude of the control signal on line 13 updates by capacitor 22. PLL 10 is continuously enabled in response to any of the following conditions:
(a) a received command indicating a switch in frequency and transmission on the new frequency,
(b) a received command calling for a transmission on the current frequency,
(c) an off-hook condition, or
(d) the loss of a received signal.

In the absence of any of conditions (a) through (d), above, the synthesizer is returned to its normally PLL disabled state with switch 20 open and switch 60 open to interrupt power to PLL 10. During the time intervals that power to PLL 10 is interrupted by switch 60, considerable battery power is saved.

Referring now to FIG. 2, there is shown a block diagram of a second embodiment of the battery saving frequency synthesizer circuit according to the present invention. As in FIG. 1 phase-locked loop 10 represents all of the phase-locked loop synthesizer components except for the VCO which is shown as a separate block 12. In this second embodiment, the switch for switching between normal and battery saving modes of operation is a single pole double throw switch 40. In normal operation (non-battery save), a loop control signal on signal line 12 from phase-locked loop 10 is coupled through switch 40 to the input of an integrator 42. The integrator 42 is represented by an amplifier 44 in combination with a feedback capacitor 46. However, other integrators will serve the same purpose. The output of integrator 42 is coupled to control input 26 of VCO 12. As in the FIG. 1 embodiment, the output of VCO 12, which is the synthesizer output, is coupled on signal line 18 to a phase comparator (or divider) within phase-locked loop 10.

In this second embodiment, during battery save operation, the phase-locked loop 10 is held close to lock by an FM receiver 48 and discriminator 50. Thus, this second embodiment is highly suitable for use in receivers or transceivers in mobile or portable communication.

Because the loop control signal of signal 13 from phase-locked loop 10 is coupled to control input 26 of the VCO 12 through an integrator 42, the phase-locked loop error signal must produce a zero error signal when locked. Thus, when locked, the magnitude of the VCO control signal applied to control input 26 will not change. Only when the signal on line 13 from phase-locked loop 10 deviates from zero will the control input to VCO 12 change.

A properly designed FM receiver 48 using an S-type discriminator can produce a DC voltage proportional to deviation between its local oscillator frequency and signal frequency as received through it and antenna 52. This DC voltage produced by FM receiver 48 and discriminator 50, known as the automatic frequency control (AFC) signal is coupled to the second throw of switch 40 and is utilized to control the phase-locked loop during battery save operation.

During battery save operation, switch 40 is switched so that the AFC output of discriminator 50 is coupled to the input of integrator 42, and power to phase-locked loop 10 via line 28 is interrupted by the opening of switch 60. During such power interruption periods, the AFC output of discriminator 50 maintains an appropriate control signal on VCO 12 unless the signal received by receiver 48 is lost or until it is desired to change received channels.

Persons skilled in the art will appreciate that the FIG. 2 embodiment may be used in many applications, such as a mobile radio telephone for example. As one example of the operation of FIG. 2, power to PPL 10 may be normally disabled or interrupted after an initial lock of the phase locked loop. During times of power interruption to PLL 10, discriminator 50 drives VCO 12. PLL 10 may be enabled in response to a condition sensor 62 sensing any one of several selected conditions and operating the switches 40, 60 to the position shown in FIG. 2. Examples of some of these conditions may be:
(a) a received command calling for a switch in frequency and transmission on the new frequency,
(b) a received command calling for transmission on the current frequency,
(c) an off-hook condition or
(d) the loss of a received signal. Obviously, all of these conditions need not be sensed. The synthesizer may be returned to its normally PLL disabled state with discriminator controll of VCO 12 by the sensor 62 operating the switches 40, 60 to the other position in response to the absence or disappearance of all selected conditions such as (a) through (d) above.

Thus, there has been provided a frequency synthesizer circuit arrangement highly suitable for mobile or portable use. During extended periods of time, power to the phase-locked loop is disabled thereby considerably extending battery life.

Of course, other alternative embodiments and modifications of the present invention will be apparent to those of ordinary skill in the art having the benefit of the teachings contained herein. Therefore, such alternate embodiments and modifications are intended to be covered within the scope of the appended claims.

What is claimed is:

1. A frequency synthesizer circuit comprising:
   a voltage controlled oscillator (VCO) having a control input;
   an integrator having an output coupled to said VCO control input and an input;
   phase-locked loop (PLL) synthesizer means for comparing a signal output of said VCO with a signal from a reference oscillator and (b) providing a loop control signal related thereto;
   means for applying and interrupting power to the PLL synthesizer means;
   switch means for selectively coupling the input of the integrator to either (a) the loop control signal from the PLL synthesizer means when power is applied thereto or (b) a receiver discriminator signal derived from a discriminator separate and distinct from said PLL synthesized means when power to the PLL synthesizer means is interrupted, whereby the frequency of the VCO is controlled by the receiver discriminator signal during periods of power interruption to the PLL synthesizer means.

2. A method for frequency synthesizing comprising the steps of:
   generating with phase-locked loop means, a loop control signal for use in controlling a voltage controlled oscillator having a control signal input;
   coupling the control signal input of the VCO to the loop control signal of the PLL means;
   locking the PLL means;
   decoupling the control signal input of the VCO from the loop control signal of the PLL means and coupling it instead to the output of a receiver discriminator separate and distinct from the PLL means so that the VCO will be controlled by the discriminator output rather than by the loop control signal from the PLL means, and
   interrupting power to the phase-locked loop means simultaneously with the decoupling of said loop control signal to the VCO.

3. A method for operating radio communications equipment having a hook switch and a phase-locked loop (PLL) synthesizer including phase-locked loop (PLL) means for generating a loop control signal, a voltage controlled oscillator (VCO) having a control input, and an integrator circuit coupled to the VCO control input, comprising the steps of:

(a) locking the PLL means and coupling the integrator circuit thereto for deriving the loop control signal from the PLL means;
   (b) interrupting power to the PLL means, decoupling the integrator circuit from said PLL means, and coupling the integrator circuit to another source of control signal separate and distinct from the PLL means;
   (c) applying power to the PLL means and coupling the integrator circuit thereto for deriving the loop control signal from the PLL means in response to any of the following:
      (aa) a received command to switch frequency from a current frequency being synthesized by said synthesizer to a new frequency and to transmit on the new frequency, or
      (bb) a received command to transmit on the current frequency, or
      (cc) an off-hook condition of said hook switch, or
      (dd) loss of a received signal;
   (d) and returning to step (b) in the absence of any one of the conditions (aa)-(dd) of step (c).

4. A method for operating radio communications equipment having a hook switch and a phase-locked loop (PLL) synthesizer including phase-locked loop (PLL) means and a voltage controlled oscillator (VCO) wherein the equipment includes a receiving section having a discriminator separate and distinct from the PLL means, comprising the steps of:
   (a) locking the PLL means to provide a loop control signal to the VCO;
   (b) synchronously interrupting power to the PLL means, decoupling said PLL means from the VCO, and coupling a signal from the discriminator to the control input of the VCO to control its frequency;
   (c) enabling the PLL means continuously in response to the occurrence of any of the following conditions;
      (aa) a received command calling for a switch in frequency from a current frequency being synthesized by said synthesizer to a new frequency and transmission on the new frequency,
      (bb) a received command calling for transmission on the current frequency,
      (cc) an off-hook condition of said hook switch, or
      (dd) loss of a received signal, and
   (d) returning to the PLL means to a disabled state wherein the output of the discriminator drives the VCO in response to the absence of any of the conditions (aa) through (dd) above.

* * * * *